Oct. 14, 1958 R. E. SWANSON 2,856,320

METHOD OF MAKING TRANSISTOR WITH WELDED COLLECTOR

Filed Sept. 8, 1955

INVENTOR.
ROBERT E. SWANSON

BY [signature]

ATTORNEY

Patented Oct. 14, 1958

2,856,320

METHOD OF MAKING TRANSISTOR WITH WELDED COLLECTOR

Robert E. Swanson, Poughkeepsie, N. Y., assignor to International Business Machines Corporation, New York, N. Y., a corporation of New York Application September 8, 1955, Serial No. 533,151

3 Claims. (Cl. 148—1.5)

This invention relates to transistors and is particularly concerned with improvement of the collector electrode or contact of transistors.

The transistors currently available are commonly classified as either point contact transistors or junction transistors. In point contact transistors, the collector and emitter electrodes are formed by sharpening the ends of wires to points and holding those points against the surface of the transistor under light pressure. Such transistors have the disadvantage of being difficult to manufacture, but they have the advantage of current amplifications greater than 1. Junction transistors commonly comprise a thin region of one conductivity type and two regions of opposite conductivity type on opposite sides of the one region. The two junctions which separate the regions then serve as the collector and emitter. Such transistors are relatively rugged as compared to point contact transistors, but they have the disadvantage that their current amplification is normally less than 1. Also, they have the further disadvantage that their collector junctions are extremely sensitive to temperature changes.

An object of the present invention is to provide an improved collector structure for transistors.

A further object is to provide such a structure which will have the high current amplification characteristic of point contact collectors, while having the rugged physical characteristics of junction collectors.

Another object is to provide a method of making a transistor having such an improved collector structure.

The foregoing objects are attained by placing a body of semi-conductive material having extrinsic conductivity of a predetermined type in contact with a wire of metal which will alloy with the semi-conductive material and containing impurities which when introduced into the semi-conductive material will produce conductivity of that predetermined type. An electrical discharge is then produced through the area of contact between the wire and the body sufficient to produce a low heat weld of the wire to the body. It has been found that in this process, if the magnitude of the current discharge is carefully controlled, there will be produced a collector structure having an intrinsic amplification greater than 1, which collector structure is physically strong by virtue of its welded connection to the transistor body.

Other objects and advantages of the invention will become apparent from a consideration of the following description and claims, taken together with the accompanying drawing.

Figure 1:
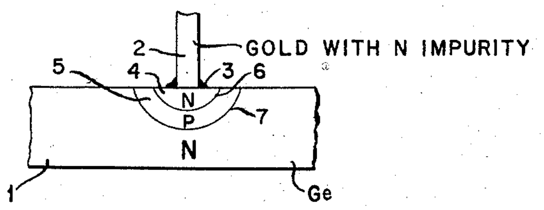
Fig. 1 is a somewhat diagrammatic view of a transistor collector constructed in accordance with the invention.

Referring to the drawing, there is shown in Fig. 1 a body of germanium 1, illustrated as N-type germanium, preferably having a resistivity of 5 to 10 ohm-centimeters. In contact with the upper surface of the body is a wire 2, which may be a gold wire with an impurity of a type which, when alloyed with the germanium will produce N-type conductivity. For example, the impurity may be antimony, and may comprise less than 1% of the material in the wire.

The wire 2 is illustrated at 3 as being welded to the body 1. The body 1 is shown as including adjacent the base of the wire 2 an N region 4 of generally hemispherical configuration. Outside the N region 4 there is illustrated a P region 5 which envelops the N region 4. The N region 4 and P region 5 are separated by a barrier junction 6. The P region 5 is separated from the main N-type region of the body 1 by a barrier junction 7.

Figure 2:
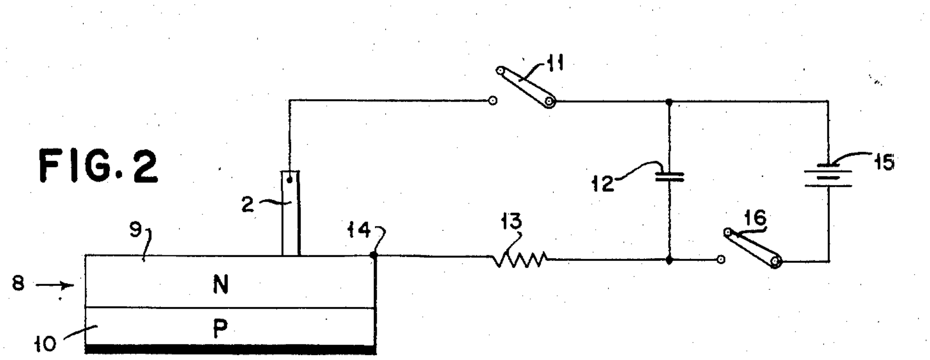
Fig. 2 is a diagrammatic illustration of a transistor body together with an electric circuit for forming a transistor collector according to the process of the present invention.

The collector structure shown in Fig. 1 may be formed by the use of the apparatus illustrated in Fig. 2, where the wire 2 is illustrated in association with a transistor body 8 including an N region 9 and a P region 10. The wide 2 is connected to an electric circuit which may be traced through a switch 11, a capacitor 12 and a resistor 13 to an ohmic contact 14 with the N region 9. In parallel with the capacitor 12 is provided a charging battery 15 and a switch 16.

In the operation of the apparatus of Fig. 2, the switch 16 is first closed for a time sufficiently long to charge the capacitor 12. The switch 16 is then opened and switch 11 is closed to discharge capacitor 12 through the wire 2 and the N region 9. If the capacitor is selected so that the discharge is sufficient to produce a low heat weld between the end of the wire 2 and the region 9, then a collecting contact will be produced.

In carrying out this process, the following essential characteristics must be observed. First, the wire 2 must be of a metal which will alloy with the semi-conductive material of the N region 9. The wire 2 must contain as an impurity a material which, when alloyed with the semi-conductive material, will produce N-type conductivity.

The diameter of the wire is not critical, substantially any wire size commonly employed for transistor collector structures being usable. A wire of .002" diameter has been found to be very suitable.

The capacitance of the capacitor 12 and the electrical potential to which it is charged are critical. A rough criterion as to the proper capacitance and potential to be used is that the discharge must not be so heavy that it produces any arcing at the contact between the wire and the semi-conductor. Too great heat will result in a "punching through" of the P region 5, so that the collector structures loses its desirable high current-amplification characteristics.

Potentials in the range from 300 to 700 volts have been used satisfactorily and capacitors varying from .02 mfd. to 1.0 mfd. have been used.

Specifically, the following combinations of potentials and capacitances have given been used and have given satisfactory transistor characteristics and good welded bonds between the wire and the semi-conductive material:

| | Mfd. |
|---|---|
| 300 volts | .05 |
| 400 volts | .08 |
| 500 volts | .02 |
| 500 volts | .05 |
| 500 volts | 1.0 |
| 700 volts | .05 |

The impedance of resistor 13 is not particularly critical.

Values ranging from 25 to 700 ohms have been used successfully. This resistance, together with the capacitance of capacitor 12, determine the time required to discharge the capacitor.

The process described is not limited to germanium as the semi-conductive material nor to gold as to the wire material. Any semi-conductor may be used for the body, and any metal may be used for the wire which will alloy with the semi-conductor. It is essential that the impurity used in the wire be one which, when alloyed into the semi-conductor material, will produce extrinsic conductivity of the same type as that previously existing in the material.

It has not been determined with certainty what takes place during the process described above. Neither has it been determined what the physical changes are in the semi-conductive material which produce the collector characteristics. However, it is presently believed that the heat generated at the area of the contact between the wire and the semi-conductor is effective to convert thermally a portion of the N-type material in the body 1 to P-type material. This converted zone of material is generally hemispherical and is shown at 5 in Fig. 1. It is further believed that the presence of the impurity in the wire 2 results in the alloying of a portion of that impurity by diffusion into the P region 5, so as to produce therein a similar hemispherical N-type region, shown at 4 in Fig. 1. There is thus produced a collector structure which, broadly speaking, is of the type known in the art as a PN hook. It is well known that such a collector has an intrinsic current amplification substantially greater than 1.

The theory expressed in the foregoing paragraphs represents one possible explanation of the phenomena described previously which take place in connection with the process of the present invention. However, as stated above, the exact physical changes which take place are not known with certainty, and it is therefore not intended that this invention be limited by any specific theory.

Figure 3:
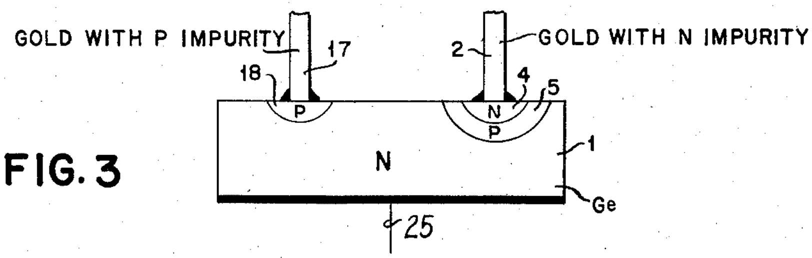
Fig. 3 is a somewhat diagrammatic view of a complete transistor constructed in accordance with the invention.

*Fig. 3*

This figure illustrates a complete transistor having a collector of the type shown in Fig. 1 and having an emitter formed by welding a gold wire 17 containing a P-type impurity to the N-type region 1. This P-type impurity enters into the region 1 during the welding process creating therein a P region 18. The formation of such welded emitter structures as shown at 17 and 18 is old in the art, and no claim is made herein to the specific emitter structure nor to the method of producing it.

An ohmic connection 25 is made to the bottom of body 1, to serve as a base connection.

Figure 4:
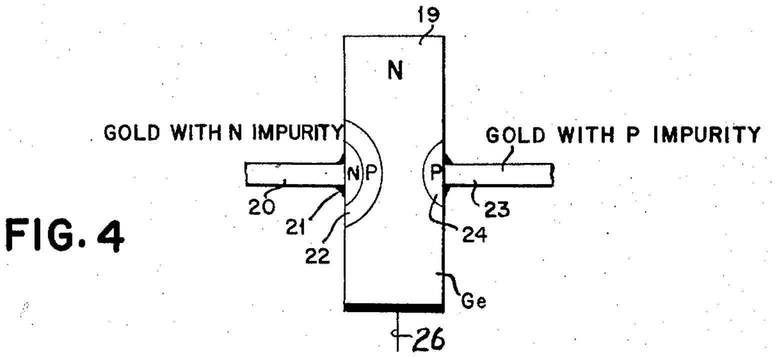
Fig. 4 is a diagrammatic view of a modified form of transistor constructed in accordance with the invention.

*Fig. 4*

This figure illustrates a modified form of transistor structure embodying the invention and including a body

19 of N-type semi-conductive material, which may be germanium having a wire 20 welded to it to form a collector according to the process described above in connection with Figs. 1 and 2. That process is effective to form in the body 19 an N region 21 and a concentric P region 22. On the opposite side of the N region 19 a wire 23 is welded to the N region, thereby producing a P region 24 in the body 19, which P region serves as an emitter. An ohmic base connection 26 is provided.

In all the transistors shown, the spacing between the collector and the emitter must be substantially no greater than the diffusion length for the average lifetime of minority carriers in the body of the transistor.

While the invention has been described as applied to transistors having a main body of N-type extrinsic conductivity, it is equally applicable to bodies having P-type extrinsic conductivity. When so applied, the wire must have in it an impurity which, when alloyed into said semi-conductive material will produce P-type conductivity.

While I have shown and described certain preferred embodiments of my invention, other modifications thereof will readily occur to those skilled in the art and I therefore intend my invention to be limited only by the appended claims.

I claim:

1. The method of making a transistor body having an amplifying collector welded thereto comprising placing a body of semi-conductive material having extrinsic conductivity of a predetermined type in contact with a wire of metal which will alloy with the semi-conductive material and containing impurities which, when alloyed into said material, produce conductivity of said predetermined type, charging a capacitor having a capacitance in the range from 0.02 mfd. to 1.0 mfd., to a potential between 300 and 700 volts, and discharging said capacitor through the area of contact between said wire and said body.

2. The method as defined in claim 1, including a resistor having an impedance from 25 to 700 ohms in series with the capacitor during the discharge.

3. The method as defined in claim 1, in which said semi-conductive material is germanium having a resistivity of 5 to 10 ohm-centimeters.

References Cited in the file of this patent

UNITED STATES PATENTS

| | | |
|---|---|---|
| 2,671,156 | Douglas et al. | Mar. 2, 1954 |
| 2,697,269 | Fuller | Dec. 21, 1954 |
| 2,713,132 | Mathews et al. | July 12, 1955 |
| 2,725,315 | Fuller | Nov. 29, 1955 |

FOREIGN PATENTS

| | | |
|---|---|---|
| 1,038,658 | France | May 13, 1953 |